(12) United States Patent
Park et al.

(10) Patent No.: US 10,203,360 B2
(45) Date of Patent: Feb. 12, 2019

(54) POWER MONITORING SYSTEM

(71) Applicant: LSIS CO., LTD., Gyeonggi-do (KR)

(72) Inventors: Hun Park, Gyeonggi-do (KR);
Young-Gyu Yu, Gyeonggi-do (KR);
Hee-Tae Roh, Gyeonggi-do (KR)

(73) Assignee: LSIS CO., LTD., Anyang-si, Gyeonggi-Do (KR)

(*) Notice: Subject to any disclaimer, the term of this patent is extended or adjusted under 35 U.S.C. 154(b) by 6 days.

(21) Appl. No.: 15/240,117

(22) Filed: Aug. 18, 2016

(65) Prior Publication Data
US 2017/0052220 A1  Feb. 23, 2017

(30) Foreign Application Priority Data

Aug. 19, 2015 (KR) .................. 10-2015-0117004
Aug. 24, 2015 (KR) .................. 10-2015-0119145

(51) Int. Cl.
| | |
|---|---|
| *G01D 4/00* | (2006.01) |
| *G01R 21/00* | (2006.01) |
| *H02J 13/00* | (2006.01) |
| *G01R 21/133* | (2006.01) |

(52) U.S. Cl.
CPC .......... *G01R 21/133* (2013.01); *G01D 4/004* (2013.01); *G01R 21/00* (2013.01); *H02J 13/0013* (2013.01); *Y02B 70/346* (2013.01); *Y02B 90/242* (2013.01); *Y02B 90/245* (2013.01); *Y02B 90/248* (2013.01); *Y02E 60/7807* (2013.01); *Y04S 20/322* (2013.01); *Y04S 20/38* (2013.01); *Y04S 20/40* (2013.01); *Y04S 20/52* (2013.01); *Y04S 20/525* (2013.01); *Y04S 40/12* (2013.01)

(58) Field of Classification Search
CPC ....... G01R 21/133; G01R 21/00; G01D 4/004
USPC .................... 324/76.11, 103 R, 142
See application file for complete search history.

(56) References Cited

U.S. PATENT DOCUMENTS

2008/0167756 A1  7/2008  Golden et al.
2013/0304266 A1  11/2013  Giannakis et al.

FOREIGN PATENT DOCUMENTS

| CN | 102640390 A | 8/2012 |
|---|---|---|
| CN | 102971929 A | 3/2013 |
| CN | 103038971 A | 4/2013 |

(Continued)

OTHER PUBLICATIONS

European search report dated Jan. 19, 2017 for corresponding EP application 16176474.1.

(Continued)

*Primary Examiner* — Amy He
(74) *Attorney, Agent, or Firm* — K&L Gates LLP

(57) ABSTRACT

Disclosed embodiments relate to a power monitoring system. In some embodiments, the power monitoring system includes: a sampling device configured to measure patterns of energy consumed by loads included in the power system; an electric meter configured to measure an amount of second energy supplied from a system to the power system; a power supply configured to supply power stored therein or generate power to supply the power system and measure an amount of third energy supplied; and an external server configured to receive at least one of the patterns, the amount of the second energy and the amount of the third energy and analyze the patterns to acquire an amount of first energy for each of the loads. In some embodiments, the external server calculates at least one of the amount of the first, second and third energy.

11 Claims, 5 Drawing Sheets

(56) References Cited

FOREIGN PATENT DOCUMENTS

| | | |
|---|---|---|
| CN | 103633639 A | 3/2014 |
| JP | 2007-510394 A | 4/2007 |
| JP | 2009213338 | 9/2009 |
| JP | 2011-083084 A | 4/2011 |
| JP | 2012016270 A | 1/2012 |
| JP | 2012191777 | 10/2012 |
| JP | 2013134740 | 7/2013 |
| JP | 2013238523 A | 11/2013 |
| JP | 2014-176161 A | 9/2014 |
| JP | 2015-10941 A | 1/2015 |
| JP | 2015010941 A | 1/2015 |
| JP | 2015108953 A | 6/2015 |
| JP | 2015-130549 A | 7/2015 |
| KR | 10-2015-0087984 A | 7/2015 |
| WO | 2012-032947 A1 | 3/2012 |
| WO | 2014184957 A1 | 11/2014 |
| WO | 2015028944 A1 | 3/2015 |

OTHER PUBLICATIONS

Office Action dated Nov. 29, 2016 issued in corresponding Korean Application No. 9-5-2016-085991375.
Japanese Office Action Appl. No. 2016-160311 dated Oct. 3, 2017—3 pages.
Chinese Office Action for related Chinese Application No. 201610670176.7; action dated Jun. 4, 2018; (8 pages).
Japanese Office Action for related Japanese Application No. 2016-160311; action dated Jul. 3, 2018; (3 pages).

POWER MONITORING SYSTEM

CROSS REFERENCE TO RELATED APPLICATIONS

This application claims the benefit of Korean Patent Application No. 10-2015-0117004, filed on Aug. 19, 2015 and entitled "POWER MONITORING SYSTEM" and Korean Patent Application No. 10-2015-0119145, filed on Aug. 24, 2015, entitled "POWER MONITORING SYSTEM", each of which are hereby incorporated by reference in their entirety.

BACKGROUND

Technical Field

The present disclosure relates to a power monitoring system. More specifically, the present disclosure relates to a power monitoring system that monitors electric energy for each of loads and to aggregate results of the monitoring to thereby monitor electric energy of the entire system.

Description of the Related Art

Typically, power being consumed in a residence can be monitored using an electric meter. Such an electric meter, however, can measure only the total amount of electric energy consumed in a residence but not the amount of electric energy consumed by each of appliances in the residence. Accordingly, a user cannot know the amount of energy consumed by each of the appliances and thus does not know which one of the appliances is to be managed in order to save energy consumption. It would be cost-inefficient to provide every appliance with an electric meter in order to measure the amount of energy consumed by the appliances.

To this end, non-intrusive load monitoring (NILM) has been developed to monitor the amount of energy consumed by every appliances in a residence. The NILM is a technique that predicts the amount of energy consumed by each of loads (appliances) in a building and a driving schedule for generating electric power by way of measuring overall voltage and current supply.

Specifically, the NILM may be carried out by using a sampling device. The sampling device can analyze patterns of how the loads consume energy while monitoring energy consumption. Specifically, the sampling device monitors contains information on energy consumption patterns each matched with one of the loads, and if a particular pattern is monitored, it is determined that an appliance matched with the pattern is consuming electric energy.

Although the amount of energy consumed by each of the loads can be measured by the sampling device, there is another problem in that it is not possible to measure the amount of energy consumption taking into account energy supplied from an external source, e.g., in a residence with a solar power generator or in a residence or a building with an energy management system. Such a common problem of NILM will be described in detail below with reference to FIG. 1.

FIG. 1 shows a typical power monitoring system including a sampling device for NILM.

As shown in FIG. 1, the power monitoring system includes a distribution board 2 that distributes power transmitted from a transmission system 1 to loads (appliances) 3. The distribution board may include a plurality of switches and a circuit breaker.

The power monitoring system includes a sampling device 10 in the distribution board. Specifically, the sampling device 10 may be disposed at a previous stage to the loads 3 and receive power before it is distributed. Accordingly, the sampling device may monitor the total amount of energy supplied to the loads 3 and may measure a pattern of energy consumed by each of the loads 3. Examples of the loads 3 may be home appliances.

As described above, however, the sampling device is usually disposed inside the distribution board, and thus the sampling device cannot monitor the amount of electric energy supplied from an external source.

Employing an additional sampling device for monitoring the amount of electric energy supplied from an external source would be cost-inefficient. Under the circumstances, according to an embodiment of the present disclosure, a power monitoring system can accurately monitor the amount of energy supplied/consumed in the overall system by combining an existing monitoring device and a single sampling device, with no additional sampling device.

SUMMARY

It is an aspect of some embodiments of the present disclosure to provide a power monitoring system that accurately monitors the amount of energy supplied/consumed in the overall system with no additional sampling device.

It is another aspect of some embodiments of the present disclosure to provide a power monitoring system that saves cost for establishing the overall system by using communications technology among the monitoring devices.

In accordance with one aspect of some embodiments of the present disclosure, a power monitoring system includes: a sampling device configured to measure patterns of energy consumed by loads included in the power system; an electric meter configured to measure an amount of second energy supplied from a system to the power system; a power supply configured to supply power stored therein or generate power to supply the power system and measure an amount of third energy supplied; and an external server configured to receive at least one of the patterns, the amount of the second energy and the amount of the third energy and analyze the patterns to acquire an amount of first energy for each of the loads. The external server calculates at least one of the amount of the first, second and third energy.

In accordance with another aspect of some embodiments of the present disclosure, a power monitoring system includes: a sampling device configured to measure patterns of how loads included in the power system consume energy; an electric meter configured to measure a first amount of energy supplied from a transmission system to the power system; a power supply configured to supply power stored therein or generate power to supply it to the power system and measure a second amount of energy supplied to the power system; a first external server configured to receive the patterns from the sampling device and analyze the received patterns to obtain a third amount of energy consumed by the loads; and a second external server configured to receive the first amount of energy and/or second amount of energy and transmit/receive data to/from the first external server. The second external server (50) receives the third amount of energy from the first external server (40) and calculates at least one of the first, second and third amounts of energy.

DETAILED DESCRIPTION

Figure 1:
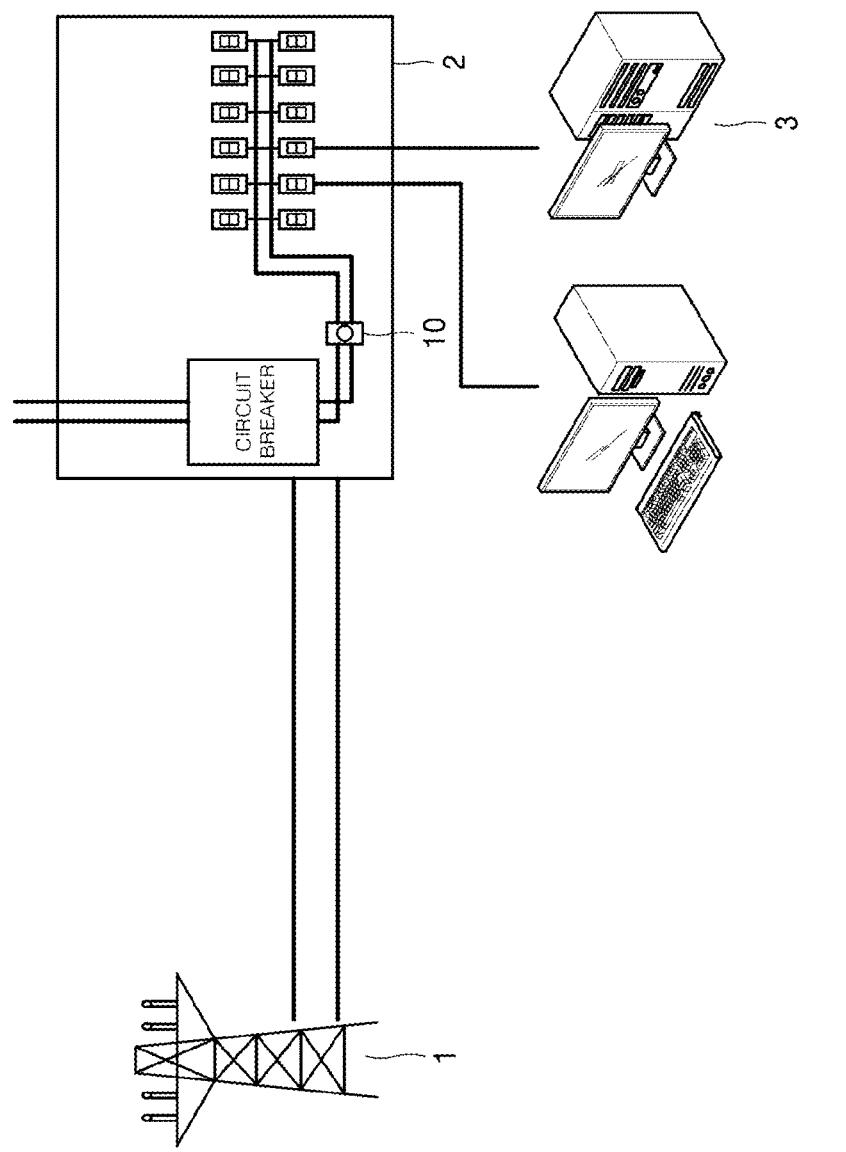
FIG. 1 shows a typical power monitoring system including a sampling device for NILM, according to the prior art.

In the following detailed description, reference is made to the accompanying drawings that show, by way of illustration, specific embodiments in which the claimed subject matter may be practiced. These embodiments are described in sufficient detail to enable those skilled in the art to practice the subject matter. However, embodiments of the present disclosure may be modified in various different ways and are not limited to some embodiments disclosed herein. In the accompanying drawings, well-known elements include been omitted in order not to unnecessarily obscure the gist of the present disclosure. Like reference numerals designate like elements throughout the disclosure.

It is to be noticed that the term "comprising", used in the present description and claims, should not be interpreted as being restricted to the means listed thereafter; it does not exclude other elements or steps.

Figure 2:
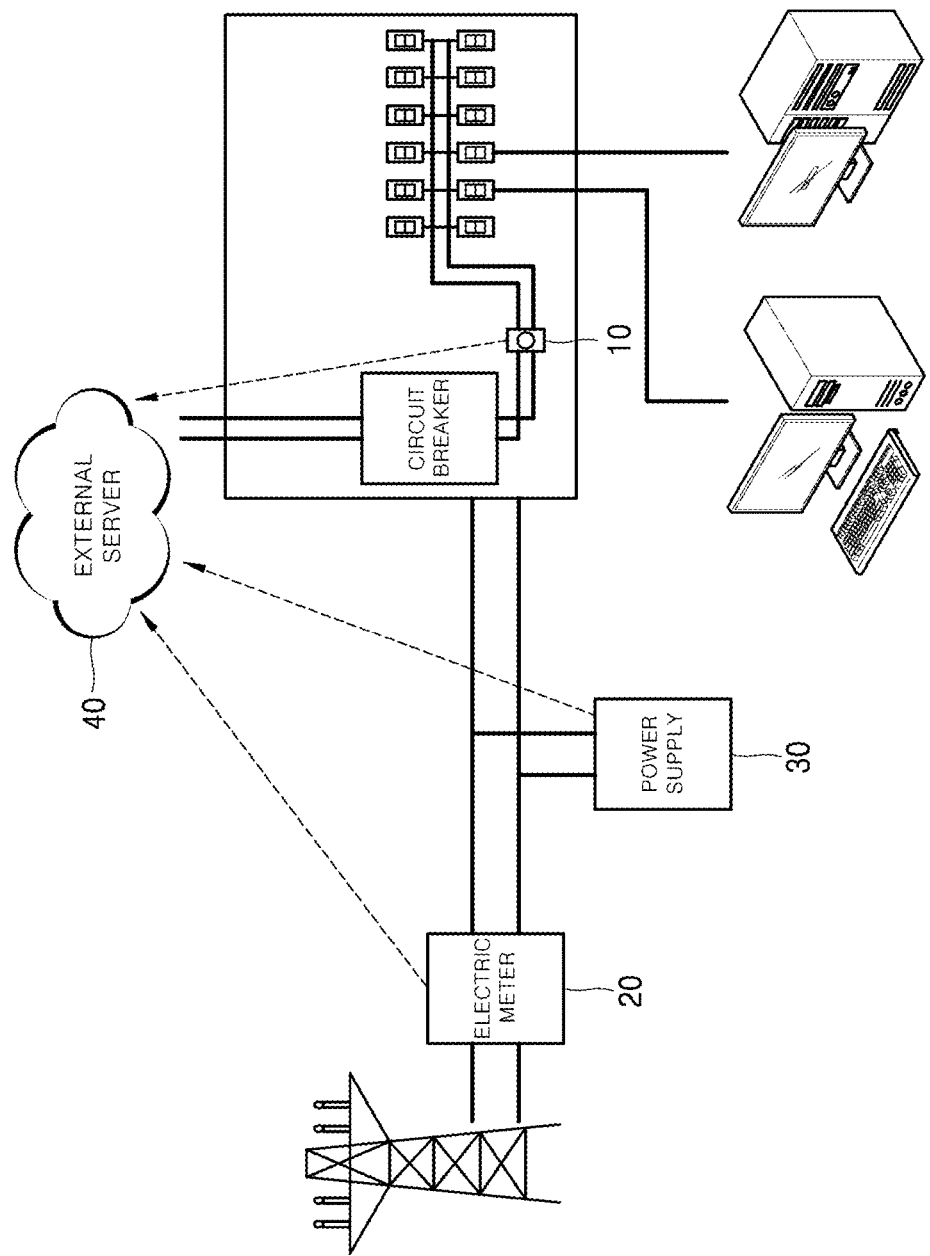
FIG. 2 is a block diagram of a power monitoring system according to a first embodiment of the present disclosure.

FIG. 2 is a block diagram of a power monitoring system according to a first embodiment of the present disclosure.

As shown in FIG. 2, the power monitoring system according to the first embodiment of the present disclosure may include a sampling device 10, an electric meter 20, a power supply 30 and an external server 40.

The sampling device 10 analyzes the energy consumed by loads in the power system, as described above. Specifically, the sampling device 10 may measure patterns of energy consumed by the loads.

The electric meter 20 may be a typical watt-hour meter. The electric meter 20 may measure the total amount of energy input/output to/from the power system. Specifically, the electric meter 20 may measure the total amount of energy by aggregating the energy consumed by the power system and the energy supplied to the power system.

The power supply 30 may supply power to the power system. For example, the power supply 30 may be a power generator. For another example, the power supply 30 may be an energy management system (EMS). The EMS may store power during off-peak hours and use the stored power during peak hours. In the case where the entire power monitoring system includes the power supply 30, the sampling device 10 can measure only the amount of energy consumed by each of the appliances but not the amount of energy supplied from the transmission system and the amount of energy supplied from the power supply 30 to the power system or the distribution board.

The external server 40 can monitor the amount of energy of the entire power system by aggregating the measurement by the electric meter 20, the measurement by the sampling device 10 and the amount energy supplied from the power supply 30. Specifically, the external server 40 may analyze patterns of energy consumed by the loads acquired from the sampling device 10, to obtain that the amount of energy consumed by each of the loads.

According to the first embodiment of the present disclosure, the external server 40 receives the total amount of energy supplied to the power system as measured by the electric meter 20. In addition, the external server 40 may receive patterns of energy consumed by the loads as measured by the sampling device 10. The external server 40 may analyze the patterns of energy consumption received via the sampling device 10 to obtain the amount of energy consumed by each of the loads.

In addition, the external server 40 calculates the amount of energy consumed by the loads acquired via the sampling device 10 based on the total amount of energy received from the electric meter 20, to obtain the total amount of the energy supplied to the power system from the power supply 30. Specifically, according to the first embodiment of the present disclosure, the external server 40 subtracts the amount of energy consumed by the loads acquired via the sampling device 10 from the total amount of energy received from the electric meter 20, to obtain the amount of the energy supplied from the power supply 30. In this manner, the external server 40 can obtain the amount of supplied energy even without receiving the amount of supplied energy from the power supply 30.

According to a variant of the first embodiment of the present disclosure, the external server 40 receives the amount of the supplied energy from the power supply 30. In addition, the external server 40 receives the amounts of energy consumed by all of the loads as measured by the sampling device 10. The external server 40 may receive the measurements from the sampling device 10 and may analyze The to calculate the amount of energy consumed by each of appliances (or loads). Then, the external server 40 calculates the amount of energy consumed by the loads acquired via the sampling device 10 based on the amount of supplied energy received from the power supply 30, to obtain the total amount of the energy supplied to the power system.

Specifically, according to the first embodiment, the external server 40 may subtract the amount of consumed energy acquired via the sampling device 10 from the amount of supplied energy received from the power supply 30, to obtain the total amount of the energy supplied to the power system. Specifically, if the obtained total amount of energy is a positive value, it may mean that the amount of energy supplied from the power supply 30 is larger than the amount of energy consumed by the loads. If the obtained total amount of energy is a negative value, on the other hand, it may mean that the amount of energy supplied from the power supply 30 is smaller than the amount of energy consumed by the loads. In this manner, the external server 40 can obtain the total amount of supplied energy even without receiving the total amount of supplied energy from the electric meter 20.

According to another variant of the first embodiment of the present disclosure, the external server 40 may receive all of the amounts of energy measured by the sampling device 10, the electric meter 20 and the power supply 30.

According to this variant of first embodiment of the present disclosure, when a failure occurs in one element of the power monitoring system, the external server 40 can obtain the amount of energy as measured by the element by calculating it.

Figure 3:
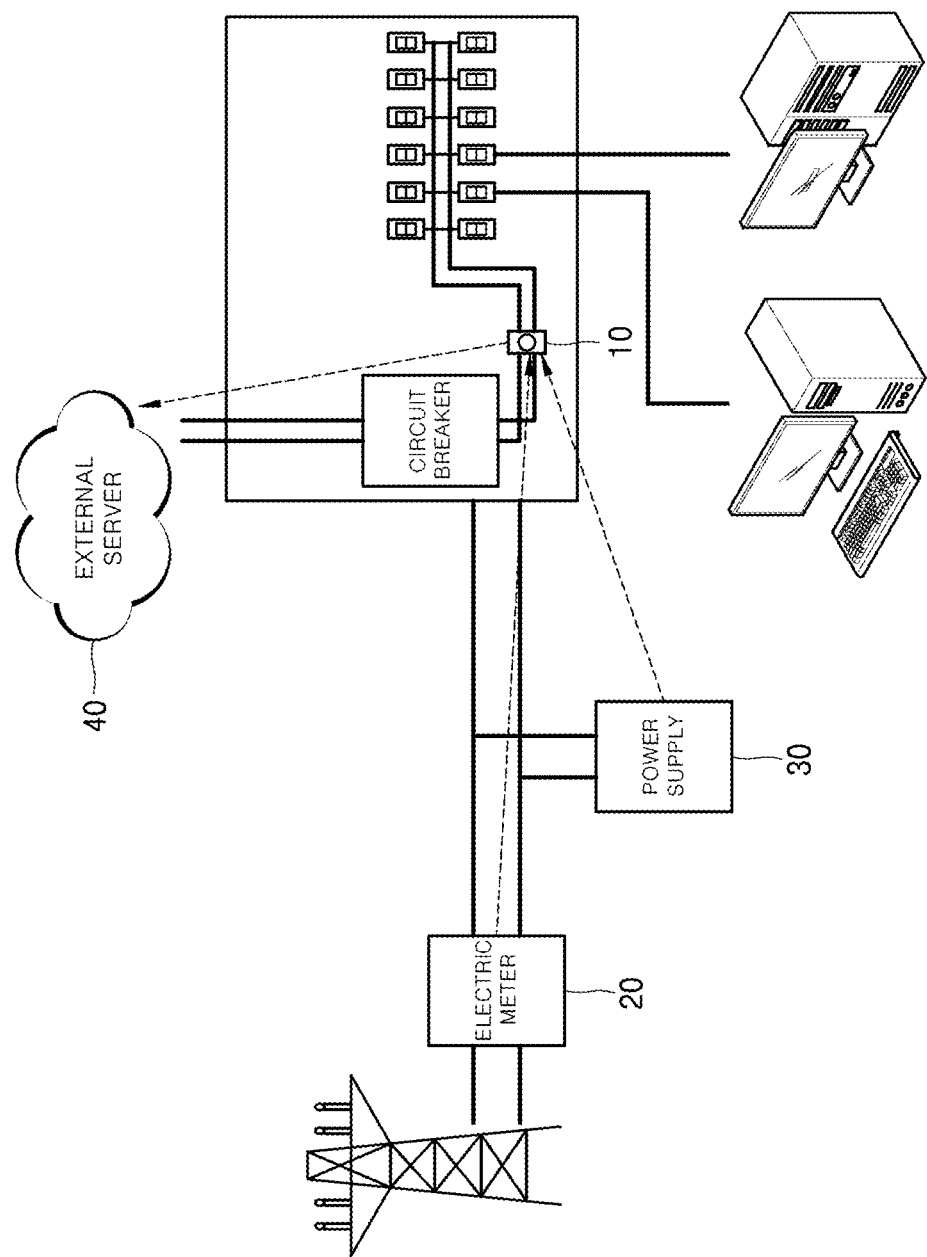
FIG. 3 is a block diagram of a power monitoring system according to a variant of the first embodiment of the present disclosure.

FIG. 3 is a block diagram of a power monitoring system according to a variant of the first embodiment of the present disclosure.

The configuration of the system shown in FIG. 3 is identical to that shown in FIG. 2; and, therefore, redundant description will be described.

According to the variant of the first embodiment of the present disclosure, the sampling device 10 receives the total amount of energy supplied to the power system as measured by the electric meter 20. In addition, the external server 40 receives the total amount of energy transmitted from the electric meter 20 to the sampling device 10, together with the total amount of energy consumed by the loads as measured by the sampling device 10. The external server 40 may receive the measurements from the sampling device 10 and may calculate the amount of energy consumed by the loads. In addition, the external server 40 calculates the amount of consumed energy acquired via the sampling device 10 based on the total amount energy as measured by the electric meter 20, to obtain the total amount of the energy supplied to the power system from the power supply 30.

Specifically, according to the variant of the first embodiment of the present disclosure, the external server 40 subtracts the amount of consumed energy acquired via the sampling device 10 from the total amount of energy as measured by the electric meter 20, to obtain the amount of energy supplied to the power system from the power supply 30. In this manner, the external server 40 can obtain the amount of supplied energy from the power supply 30 even without receiving the amount of supplied energy from the power supply 30.

According to another variant of the first embodiment of the present disclosure, the sampling device 10 receives the amount of the supplied energy from the power supply 30. In addition, the sampling device 10 may measure energy consumption patterns of the loads. The external server 40 may receive the measurements from the sampling device 10 and may analyze the measurements to calculate the amount of energy consumed by each of the loads.

Then, the external server 40 calculates the amount of consumed energy acquired via the sampling device 10 based on the amount of supplied energy as measured by the power supply 30, to obtain the total amount of energy supplied to the power system. Specifically, according to the variant of the first embodiment, the external server 40 may subtract the amount of consumed energy acquired via the sampling device 10 from the amount of supplied energy as measured the power supply 30, to obtain the total amount of the energy supplied to the power system. Specifically, if the obtained total amount of energy is a positive value, it may mean that the amount of energy supplied from the power supply 30 is larger than the amount of energy consumed by the loads. If the obtained total amount of energy is a negative value, on the other hand, it may mean that the amount of energy supplied from the power supply 30 is smaller than the amount of energy consumed by the loads. In this manner, the external server 40 can obtain the total amount of supplied energy even without receiving the total amount of supplied energy from the electric meter 20.

According to another variant of the first embodiment of the present disclosure, the external server 40 may receive all of the amounts of energy measured by the sampling device 10, the electric meter 20 and the power supply 30.

The sampling device 10, the electric meter 20, the power supply 30 and the external server 40 may transmit the measured values among them using wired/wireless communications.

Figure 4:
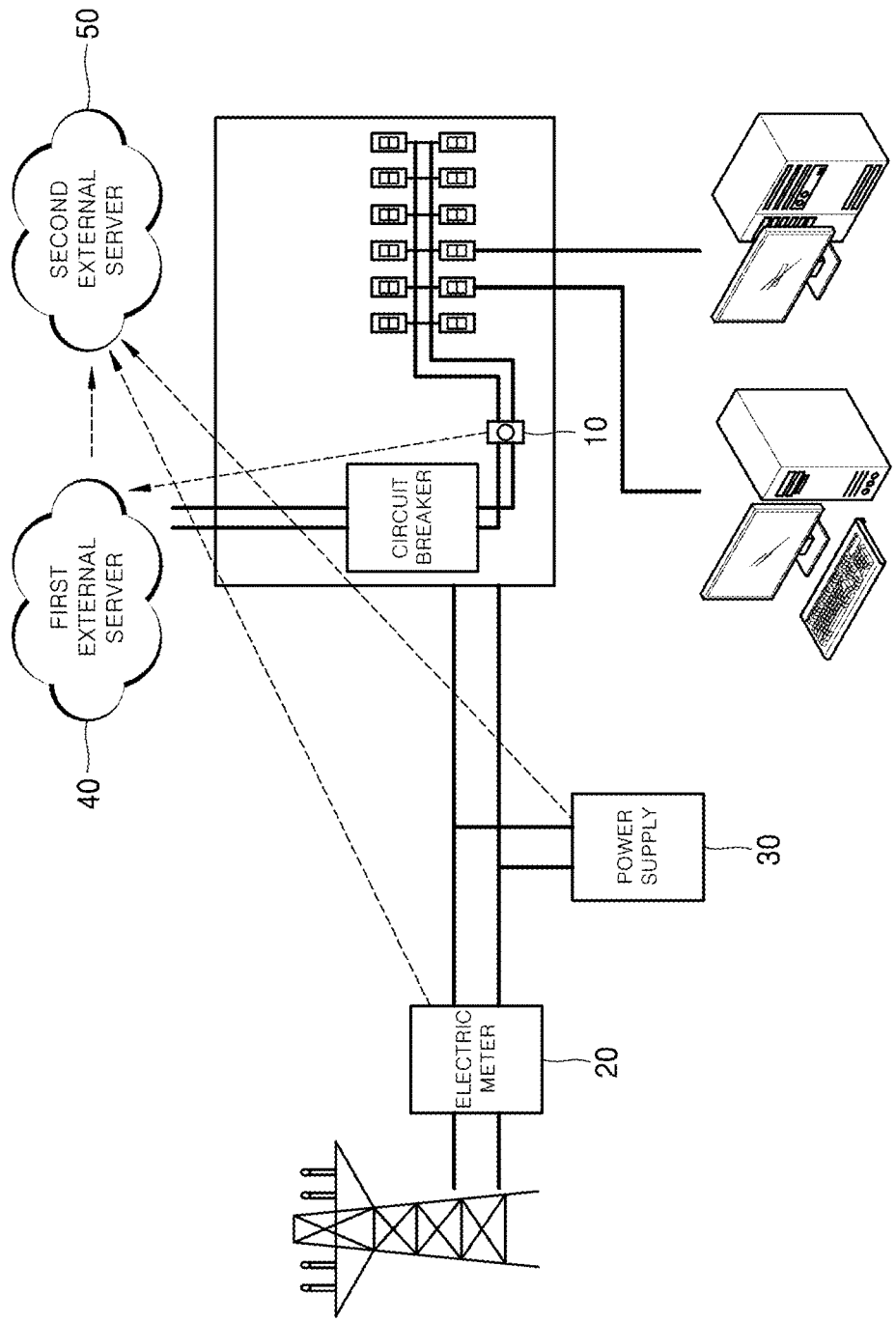
FIG. 4 is a block diagram of a power monitoring system according to the second embodiment of the present disclosure.

As shown in FIG. 4, the power monitoring system according to a second embodiment of the present disclosure may include a sampling device 10, an electric meter 20, a power supply 30, a first external server 40 and a second external server 50. The two external servers included the power monitoring system may be run by different entities. As the two external servers are run by different entities, the power monitoring system may include an advantage in terms of operation.

FIG. 4 is a block diagram of a power monitoring system according to the second embodiment of the present disclosure.

The configuration and functionality of the electric meter 20 and the power supply 30 of the power monitoring system according to the second embodiment are identical to those of the first embodiment; and, therefore, redundant description will be omitted.

The sampling device 10 analyzes the energy consumed by loads in the power system, as described above. Specifically, the sampling device 10 may analyze the energy consumed by the loads to calculate the amount of consumed energy.

The first external server 40 receives results of the analysis from the sampling device 10. The first external server 40 may receive the total amount of energy consumed by appliances from the sampling device 10 and may analyze it by using an NILM algorithm to obtain the amount of energy consumed by each of the loads. The first external server 40 may transmit the obtained amount of energy consumed by each of the loads to a second external server 50. Specifically, the first external server 40 may be an NILM company. The first external server 40 may accumulate the obtained amount of energy to store it as statistical data. In addition, the first external server 40 may collect energy consumption data from a plurality of power system. The first external server 40 may use the collected statistical data to create large data or big data. Consumers may access the first external server 40 to acquire the statistical data and may make a plan for energy consumption based on the acquired data. In addition, consumers may access the first external server 40 to establish a business plan based on the statistical data. In other words, consumers or users may send a request for data to the first external server 40 for their own purposes. For example, a construction plan such as building a power plant may be established based on the data provided from the first external server 40.

The second external server 50 acquires the amount of energy measured by the electric meter 20 and/or the energy amount data measured by the power supply 30. In addition, the 50 may transmit/receive data regarding the measured amount of energy to/from the first external server 40. The electric meter 20 and the power supply 30 may transmit the measured energy amount data using wired/wireless communications. The second external server 50 may provide the obtained energy amount data to users.

According to the second embodiment of the present disclosure, the first external server 40 receives the amounts of energy consumed by all of the loads as measured by the sampling device 10. The first external server 40 may receive the measurements from the sampling device 10 and may analyze them to calculate the amount of energy consumed by each of appliances (or loads). The first external server 40 may transmit the energy amount data associated with the loads to the second external server 50. The second external server 50 acquires the measured amount of energy from the electric meter 20. Then, the second external server 50 calculates the amount of consumed energy received from the first external server 40 based on the total amount of energy supplied from the transmission system as received from the electric meter 20, to obtain the amount of the energy supplied from the power supply 30. Specifically, according to the second embodiment of the present disclosure, the second external server 50 subtracts the amount of consumed energy received from the first external server 40 from the total amount of energy received from the electric meter 20, to obtain the amount of the energy supplied from the power supply 30 to the power system. In this manner, the second external server 50 can obtain the amount of supplied energy even without receiving the amount of supplied energy from the power supply 30. In addition, the second external server 50 may provide the received data and the calculated data values to users.

According to a variant of the second embodiment of the present disclosure, the second external server 50 receives the amount of energy supplied to the power system as measured by the power supply 30. In addition, the 50 receives the amount energy consumed by the loads as analyzed by the sampling device 10 via the first external server 40. In doing so, the first external server 40 may receive the measurement from the sampling device 10 and may analyze it to calculate the amount of energy consumed by each of the loads. Then, the second external server 50 calculates the amount of consumed energy received from the first external server 40 based on the amount of supplied energy received from the power supply 30, to obtain the amount of the energy supplied from the transmission system to the power system, e.g., the loads. Specifically, according to the second embodiment, the second external server 50 may subtract the amount of consumed energy received from the first server 40 from the amount of supplied energy received from the power supply 30, to obtain the total amount of the energy supplied from the transmission system to the power system. Specifically, if the obtained total amount of energy is a positive value, it may mean that the amount of energy supplied from the power supply 30 is larger than the amount of energy consumed by the loads. If the obtained total amount of energy is a negative value, on the other hand, it may mean that the amount of energy supplied from the power supply 30 is smaller than the amount of energy consumed by the loads. In this manner, the second external server 50 can obtain the total amount of supplied energy even without receiving the total amount of energy supplied from the transmission system from the electric meter 20.

According to a variant of the second embodiment of the present disclosure, the second external server 50 may receive all of the amounts of energy measured by the electric meter 20, the power supply 30, and the first external server 40.

According to this embodiment of the present disclosure, when a failure occurs in one element of the power monitoring system, the second external server 50 can obtain the amount of energy as measured by the element by calculating it.

Figure 5:
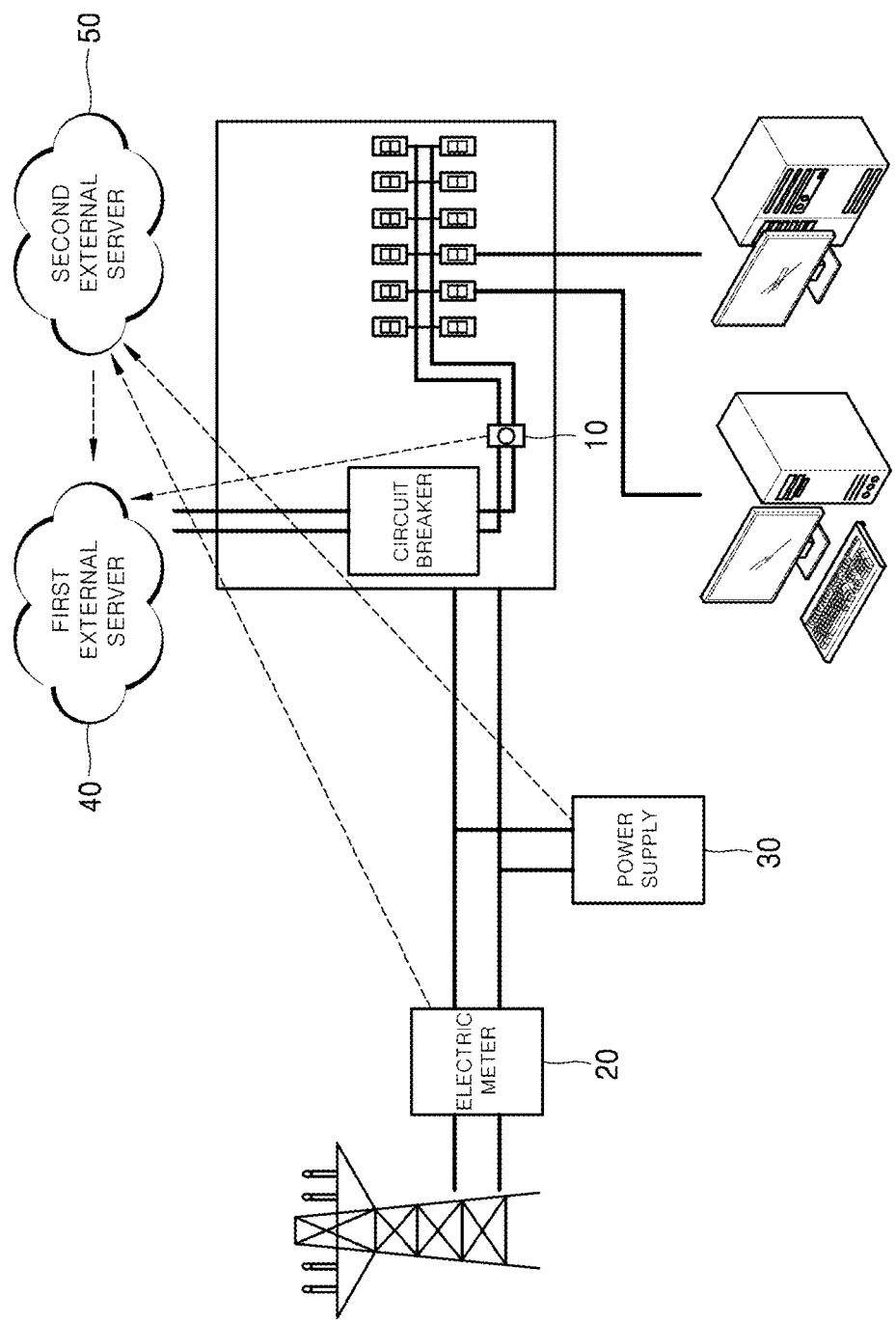
FIG. 5 is a block diagram of a power monitoring system according to a variant of the second embodiment of the present disclosure.

FIG. 5 is a block diagram of a power monitoring system according to a variant of the second embodiment of the present disclosure.

The configuration of the system shown in FIG. 5 is identical to that shown in FIG. 4; and, therefore, redundant description will be described.

Unlike the system according to the second embodiment shown in FIG. 4, in the system according to the variant of the second embodiment shown in FIG. 5, the first external server 40 may aggregate all of the received amounts of energy to calculate them. Specifically, the first external server 40 may receive the amount of energy measured by the electric meter 20 and the energy amount data measured by the power supply 30 via the second external server 50. The first external server 40 may analyze the energy consumption patterns of the loads received from the sampling device 10 to obtain the amount of energy consumed by each of the loads.

The second external server 50 may convert the energy amount data received from the electric meter 20 and the power supply 30 to transmit it to the first external server 40. Specifically, according to the second embodiment of the present disclosure, the second external server 50 may convert analog values received from the electric meter 20 and the power supply 30 into digital values, to transmit them to the first external server 40.

In this case, the first external server 40 may aggregate the measured amounts of energy immediately with no additional converting procedure.

According to the second embodiment of the present disclosure, the first external server 40 may receive the total amount of energy supplied from the transmission system via the second external server 50 and may calculate the amount of energy consumed by the loads received from the sampling device 10, to obtain the amount of energy supplied from the power supply 30 to the power system.

According to a variant of the second embodiment of the present disclosure, the first external server 40 may receive the amount of energy supplied from the power supply 30 to the power system via the second external server 50, and may calculate the amount of energy consumed by the loads received from the sampling device 10, to obtain the total amount of energy supplied from the transmission system.

The first external server 40 may compare the obtained amount of energy with other power systems and may transmit the results of the comparison to the second external server 50. Users may make a plan for energy consumption based on comparison data received from the first external server 40.

As set forth above, according to first and second embodiments of the present disclosure, there is provided a power monitoring system that accurately monitors the amount of energy supplied/consumed in the overall system with no additional sampling device.

In addition, according to first and second embodiments of the present disclosure, there is provided a power monitoring system that saves cost for establishing the overall system by using communications technology among the monitoring devices.

References to "one embodiment" or "some embodiments" do not necessarily refer to the same embodiment, although they may. Further, a particular feature, structure, effect in some embodiments may be practiced in other embodiments by combining or modifying them by those skilled in the art. Accordingly, it is to be understood that such combinations and modifications also fall within the scope of the present disclosure.

Although the embodiments of the present disclosure include been disclosed for illustrative purposes, those skilled in the art would appreciate that various modifications and substitutions may be made without departing from the scope and spirit of the disclosure. For example, elements of the embodiment of the present disclosure may be modified. Such modifications and substitutions are also construed as falling within the scope of the present disclosure as defined by the appended claims. The accompanying claims and their equivalents are intended to cover such forms or modifications as would fall within the scope and spirit of the protection. Various components illustrated in the figures may be implemented as hardware and/or software and/or firmware on a processor, ASIC/FPGA, dedicated hardware, and/or logic circuitry. Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

What is claimed is:

1. A power monitoring system comprising:
    a sampling device configured to measure patterns of energy consumed by loads included in the power monitoring system;
    an electric meter configured to measure a first amount of energy supplied from a transmission system to the power monitoring system;
    a power supply configured to supply power stored therein or generate power to supply it to the power monitoring system; and
    an external server configured to receive the patterns and obtain a third amount of energy for all the loads by analyzing the patterns,
    wherein the external server is further configured to:
        receive one of the first amount of energy and a second amount of energy, wherein the second amount of energy is an amount of energy supplied from the power supply; and
        calculate any one of the first amount of energy and the second amount of energy that is not received by the external server,
    wherein if the first amount of energy is not received by the external server, the external server is configured to subtract the third amount of energy from the second amount of energy to calculate the first amount of energy,
    wherein if the calculated first amount of energy is a positive value, it is determined that the second amount of energy supplied from the power supply is larger than the third amount of energy consumed by the loads,
    wherein if the calculated first amount of energy is a negative value, it is determined that the second amount of energy supplied from the power supply is smaller than the third amount of energy consumed by the loads.

2. The power monitoring system of claim 1, wherein the external server is further configured to subtract the third amount of energy from the first amount of energy to obtain the second amount of energy when the second amount of energy is not received.

3. The power monitoring system of claim 1, wherein the sampling device is further configured to receive the first amount of energy and the second amount of energy, and transmit the first amount of energy and the second amount of energy to the external server together with the patterns.

4. The power monitoring system of claim 1, wherein the power supply comprises at least one of an energy management system and a power generator.

5. A power monitoring system comprising:
    a sampling device configured to measure patterns of energy consumed by loads included in the power monitoring system;
    an electric meter configured to measure a first amount of energy supplied from a transmission system to the power monitoring system;
    a power supply configured to supply power stored therein or generate power to supply it to the power monitoring system;
    a first external server configured to receive the patterns from the sampling device and analyze the patterns to obtain a third amount of energy consumed by all the loads; and
    a second external server configured to receive at least one of the first amount of energy and a second amount of energy and transmit/receive data to/from the first external server, wherein the second amount of energy is an amount of energy supplied from the power supply,
    wherein the second external server is further configured to receive the third amount of energy from the first external server and calculate the first amount of energy or the second amount of energy that is not received by the second external server,
    wherein if the first amount of energy is not received by the second external server, the second external server is configured to subtract the third amount of energy from the second amount of energy to calculate the first amount of energy,
    wherein if the calculated first amount of energy is a positive value, it is determined that the second amount of energy supplied from the power supply is larger than the third amount of energy consumed by the loads,
    wherein if the calculated first amount of energy is a negative value, it is determined that the second amount of energy supplied from the power supply is smaller than the third amount of energy consumed by the loads.

6. The power monitoring system of claim 5, wherein the second external server is further configured to subtract the third amount of energy from the first amount of energy to obtain the second amount of energy when the second amount of energy is not received.

7. The power monitoring system of claim 5, wherein the second external server is further configured to receive at least one of the first amount of energy and the second amount of energy, and convert at least one of the first amount of energy and the second amount of energy in the form of an analog signal into digital signal to transmit to the first external server.

8. The power monitoring system of claim 5, wherein the power supply comprises at least one of an energy management system and a power generator.

9. The power monitoring system of claim 5, wherein the first external server is further configured to analyze the patterns acquired from the sampling device to determine the first, second, and third amount of energy of the loads.

10. The power monitoring system of claim 9, wherein the first external server is further configured to create data based on statistical data and provide the created data to a user upon request.

11. The power monitoring system of claim 5, wherein the first external server is further configured to accumulate the acquired third amount of energy to store as statistical data.

* * * * *